(12) United States Patent
Loeppert

(10) Patent No.: US 10,206,023 B2
(45) Date of Patent: Feb. 12, 2019

(54) TRANSDUCER PACKAGE WITH THROUGH-VIAS

(71) Applicant: Knowles Electronics, LLC, Itasca, IL (US)

(72) Inventor: Pete Loeppert, Durand, IL (US)

(73) Assignee: Knowles Electronics, LLC, Itasca, IL (US)

(*) Notice: Subject to any disclaimer, the term of this patent is extended or adjusted under 35 U.S.C. 154(b) by 259 days.

(21) Appl. No.: 15/202,899

(22) Filed: Jul. 6, 2016

(65) Prior Publication Data
US 2018/0014099 A1    Jan. 11, 2018

(51) Int. Cl.
| H04R 1/00 | (2006.01) |
| H04R 1/04 | (2006.01) |
| H04R 19/00 | (2006.01) |
| H04R 19/04 | (2006.01) |
| H04R 31/00 | (2006.01) |

(52) U.S. Cl.
CPC ............ *H04R 1/04* (2013.01); *H04R 19/005* (2013.01); *H04R 19/04* (2013.01); *H04R 31/006* (2013.01); *H01L 2924/1461* (2013.01); *H04R 2201/003* (2013.01); *H04R 2499/11* (2013.01)

(58) Field of Classification Search
CPC ........ H04R 19/04; H04R 19/005; H04R 1/04; H04R 31/006; H04R 2201/003
See application file for complete search history.

(56) References Cited

U.S. PATENT DOCUMENTS

| 7,190,038 B2 | 3/2007 | Dehe et al. |
| 7,473,572 B2 | 1/2009 | Dehe et al. |
| 7,781,249 B2 | 8/2010 | Laming et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,856,804 B2 | 12/2010 | Laming et al. |
| 7,903,831 B2 | 3/2011 | Song |
| 8,983,105 B2 | 3/2015 | Reining |
| 9,078,063 B2 | 7/2015 | Loeppert et al. |
| 2005/0207605 A1 | 9/2005 | Dehe et al. |
| 2007/0278501 A1 | 12/2007 | MacPherson et al. |
| 2008/0063232 A1* | 3/2008 | Song ................... H04R 19/005 381/355 |

(Continued)

OTHER PUBLICATIONS

International Search Report and Written Opinion, PCT/US2017/037262, Knowles Electronics, LLC, 10 pages dated Sep. 20, 2017.

*Primary Examiner* — Matthew A Eason
(74) *Attorney, Agent, or Firm* — Foley & Lardner LLP

(57) ABSTRACT

A microphone includes a microelectromechanical system (MEMS) die configured to sense an acoustic signal, a base, and a lid. The base has a top surface and a bottom surface. The bottom surface includes a first electrical pad and a second electrical pad. The first electrical pad and the second electrical pad are configured to transmit an electrical signal indicative of the acoustic signal. The lid has a top surface and a bottom surface. The lid includes a cavity that surrounds the MEMS die. The top surface of the lid includes a third electrical pad and a fourth electrical pad. The first electrical pad and the third electrical pad are electrically connected, and the second electrical pad and the fourth electrical pad are electrically connected.

19 Claims, 7 Drawing Sheets

(56) References Cited

U.S. PATENT DOCUMENTS

| | | |
|---|---|---|
| 2008/0175425 A1 | 7/2008 | Roberts et al. |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0180655 A1 | 7/2009 | Tien et al. |
| 2009/0218668 A1* | 9/2009 | Zhe ................ B81C 1/00301 257/680 |
| 2010/0046780 A1 | 2/2010 | Song |
| 2010/0052082 A1 | 3/2010 | Lee et al. |
| 2010/0128914 A1 | 5/2010 | Khenkin |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2014/0294209 A1 | 10/2014 | Szczech et al. |
| 2015/0166335 A1 | 6/2015 | Loeppert et al. |
| 2016/0100256 A1 | 4/2016 | Watson et al. |

\* cited by examiner

TRANSDUCER PACKAGE WITH THROUGH-VIAS

BACKGROUND

The following description is provided to assist the understanding of the reader. None of the information provided or references cited is admitted to be prior art.

Microelectromechanical systems (MEMS) are used in devices that are relatively small. For example, MEMS devices are used in small electronic devices. Devices such as smartphones, tablets, headsets, and other computing devices may use one or more MEMS devices such as MEMS microphones. Some MEMS microphones are designed and fabricated to reduce the cost of the package and/or be suitable for multiple applications.

SUMMARY

In general, one aspect of the subject matter described in this specification can be embodied in a microphone. The microphone includes a microelectromechanical system (MEMS) die configured to sense an acoustic signal, a base, and a lid. The base has a top surface and a bottom surface. The bottom surface includes a first electrical pad and a second electrical pad. The first electrical pad and the second electrical pad are configured to transmit an electrical signal indicative of the acoustic signal. The lid has a top surface and a bottom surface. The lid includes a cavity that surrounds the MEMS die. The top surface of the lid includes a third electrical pad and a fourth electrical pad. The first electrical pad and the third electrical pad are electrically connected, and the second electrical pad and the fourth electrical pad are electrically connected.

In some embodiments of the microphone, the base comprises a port that allows the acoustic signal to pass through the base. In some embodiments of the microphone, the first electrical pad and the third electrical pad are electrically connected by way of a first via through the lid, and the second electrical pad and fourth electrical pad are electrically connected by way of a second via through the lid. In some embodiments of the microphone, the base and the lid are acoustically sealed to one another with an epoxy. In some embodiments, the epoxy is between the base and the lid around a continuous perimeter of the base. In alternative embodiments, the epoxy forms a seal between the top surface of the base and a side surface of the lid around a perimeter of the base and the lid.

In some embodiments of the microphone, the cavity is cylindrical. In some instances, a perimeter of the lid is rectangular, and the first electrical pad and the third electrical pad are electrically connected by way of a first via through the lid. In such instances, the second electrical pad and fourth electrical pad are electrically connected by way of a second via through the lid. In some embodiments of the microphone, the lid comprises an inside wall that defines the cavity, and the lid comprises an outside wall along a perimeter of the lid. In such embodiments, the first via and the second via pass through the lid between the inside wall and the outside wall. In some embodiments of the microphone, the first electrical pad and the second electrical pad are on opposite sides of the microphone from the third electrical pad and the fourth electrical pad.

In general, one aspect of the subject matter described in this specification can be embodied in a method for assembling microphones. The method includes attaching a microelectromechanical system (MEMS) die to a base. The MEMS die is configured to convert an acoustic signal into an electrical signal. The method also includes electrically connecting a first pad on the MEMS die to a first trace on a top surface of the base and electrically connecting a second pad on the MEMS die to a second trace on the top surface of the base. The method further includes soldering a first via of a lid to a first via of the base. The first via of the base is electrically connected to the first trace and to a first pad on a bottom surface of the base. The first via of the lid is electrically connected to a first pad on the lid. The method also includes soldering a second via of the lid to a second via of the base. The second via of the base is electrically connected to the second trace and to a second pad on the bottom surface of the base. The second via of the lid is electrically connected to a second pad on the lid.

In some embodiments of the method, the method further includes sealing the lid to the base using an epoxy. In some instances, sealing the lid to the base includes causing epoxy to flow between the lid and the base around a perimeter of the base. In some instances, sealing the lid to the base includes forming a seal between a side wall of the lid and the top surface of the base around a perimeter of the base and the lid.

In some embodiments of the method, the method also includes attaching the MEMS die to the base comprises placing the MEMS die over a port in the base. In some embodiments of the method, attaching the MEMS die to the base includes using an epoxy to to secure the MEMS die to the base. In some embodiments of the method, soldering the first via of the lid to the first via of the base causes the first pad on the lid to be electrically connected to the first pad on the bottom surface of the base, and soldering the second via of the lid to the second via of the base causes the second pad on the lid to be electrically connected to the second pad on the bottom surface of the base.

In some embodiments of the method, the method also includes placing the lid onto the base such that a cylindrical cavity of the lid surrounds the MEMS die. In some embodiments of the method, the method also includes dicing a package from a panel of packages. The package includes the base and the lid. The MEMS die is within the package. In some instances, the method further includes partially filling a volume with an epoxy. The volume is defined at least in part by a base panel that includes the base, a frame that extends from the base panel around a perimeter of the base panel, and the lid.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

Figures 1A, 1B, 1C:
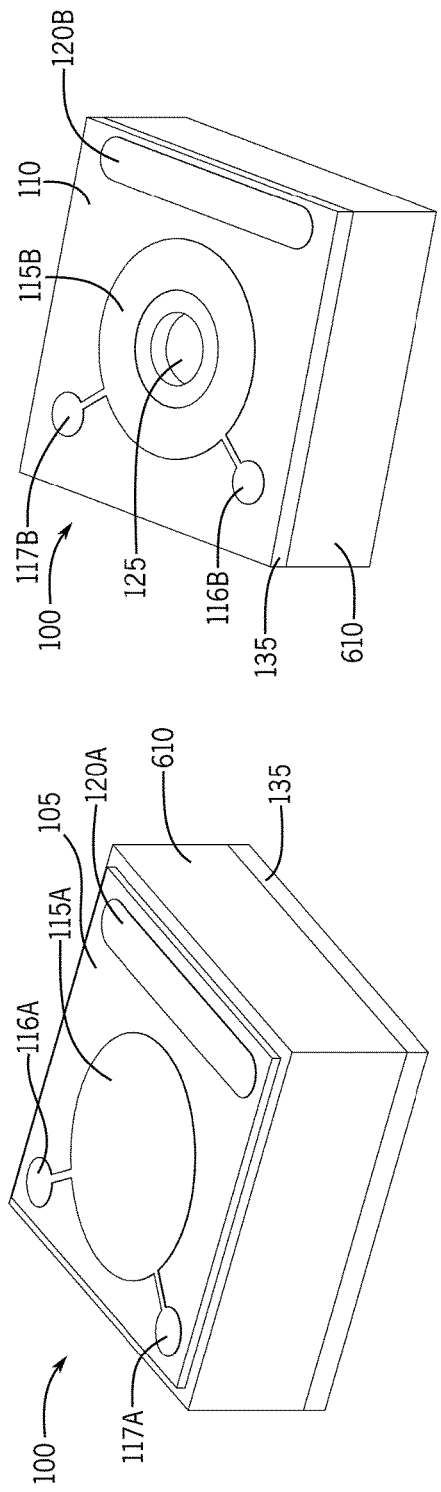
FIGS. 1A-1C are illustrations of a MEMS microphone in accordance with an illustrative embodiment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

Microelectromechanical systems (MEMS) can be used by a computing device to interact with the physical world. For example, smartphones include one or more MEMS microphones. The MEMS microphones can be used to create electrical signals indicative of an acoustic signal, such as an acoustic wave.

Traditionally, MEMS microphones are provided as either bottom port microphones or top port microphones. Bottom port microphones have electrical pads on the same side of the microphone as the acoustic port. Top port microphones have electrical pads on the opposite side of the microphone as the acoustic port. In embodiments described herein, a MEMS microphone (e.g., the MEMS microphone 100 of FIGS. 1A-1C, described in greater detail below) includes electrical pads on two sides of the microphone. Thus, the MEMS microphone 100 can operate as a top port microphone or a bottom port microphone. For example, the MEMS microphone 100 can operate as a bottom port microphone by attaching the MEMS microphone to a printed circuit board via electrical pads on a surface of the MEMS microphone that includes the acoustic port. Alternatively, the MEMS microphone 100 can operate as a top port microphone by attaching the MEMS microphone 100 to a printed circuit board via electrical pads on a surface of the MEMS microphone 100 that is opposite from the acoustic port.

FIGS. 1A-1C are illustrations of a MEMS microphone in accordance with an illustrative embodiment. FIG. 1A shows the top of a MEMS microphone 100, and FIG. 1B shows the bottom of the MEMS microphone 100. FIG. 1C is a cross-sectional view of the MEMS microphone 100. An illustrative MEMS microphone 100 includes a base 135 and a lid 140. The lid 140 has a top surface 105 and the base 135 has a bottom surface 110. The top surface 105 includes first electrical pads 115A, 116A, and 117A, and a second electrical pad 120A; the bottom surface 110 include first electrical pads 115B, 116B, and 117B and a second electrical pad 120B. The first electrical pads 115A, 116A, and 117A of the top surface 105 are electrically connected to the first electrical pads 115B, 116B, and 117B of the bottom surface 110. The second electrical pad 120A of the top surface 105 is electrically connected to the second electrical pad 120B of the bottom surface 110. Having electrical pads on the top surface 105 and the bottom surface 110 allow the same MEMS microphone 100 to be installed in a device as either a top port microphone or a bottom port microphone.

The embodiment shown in FIGS. 1A-1C includes an acoustic port 125 that allows a MEMS die 130 to interact with acoustic energy. That is, an acoustic wave (e.g., variations in air pressure) can pass through the acoustic port 125 and cause the MEMS die 130 to sense the acoustic wave. The MEMS die 130 includes a transducer. At least one electrical characteristic of the MEMS die 130 changes in response to the acoustic wave. For example, the MEMS die 130 can include a diaphragm and a backplate that are arranged parallel to each other. A capacitance between the diaphragm and the backplate can be monitored to sense the acoustic wave. The diaphragm can move relative to the backplate when the acoustic wave interacts with the MEMS die 130. By monitoring the capacitance or the voltage across the diaphragm and the backplate, the acoustic wave can be converted into an electrical signal. In some embodiments, the MEMS die 130 includes a capacitive MEMS transducer die. In alternative embodiments, the MEMS die 130 includes a piezoelectric MEMS transducer die. In some embodiments, the MEMS die 130 includes integrated CMOS circuitry.

Generally, an electronic circuit either on the MEMS die 130 or contained in an ASIC die on the surface of the base 135 (e.g., next to the MEMS die 130) converts the change of the electrical characteristic of the MEMS die 130 into an electrical signal. In the embodiment shown in FIGS. 1A-1C, the first electrical pads 115A, 115B, 116A, 116B, 117A, and 117B are electrically connected to the diaphragm and the second electrical pads 120A and 120B are electrically connected to the backplate. In an alternative embodiment, the first electrical pads 115A, 115B, 116A, 116B, 117A, and 117B are electrically connected to the backplate and the second electrical pads 120A and 120B are electrically connected to the diaphragm. In yet another embodiment, the first electrical pads 115A, 115B, 116A, 116B, 117A, and 117B are connected to the positive and negative terminals of the electronic circuit contained within the MEMS die 130 or adjacent to the MEMS die 130.

In an illustrative embodiment, the MEMS microphone 100 can be used as either a top port microphone or a bottom port microphone. For example, the MEMS microphone 100 can be attached to a printed circuit board using the first electrical pads 115B, 116B, and/or 117B of the bottom surface 110 and the second electrical pad 120B of the bottom surface 110, thereby using the MEMS microphone 100 as a bottom port microphone. In another example, the MEMS microphone 100 can be attached to a printed circuit board using the first electrical pads 115A, 116A, and/or 117A of the top surface 105 and the second electrical pad 120A of the top surface 105, thereby using the MEMS microphone 100 as a top port microphone.

Providing a MEMS microphone that can be used either as a top port microphone or a bottom port microphone can provide various advantages. For example, a device such as a smartphone can include multiple MEMS microphones (e.g., two, three, four, five, etc. MEMS microphones). Devices can use multiple MEMS microphones, for example, for noise cancellation. The configuration of the smartphone, such as where the MEMS microphones are located within the smartphone, can require that some of the MEMS microphones be top port microphones, and others be bottom port microphones. Using multiple MEMS microphones, such as the MEMS microphone 100 for the top port microphones and for the bottom port microphones, provides that each MEMS microphone within the smartphone has the same microphone characteristics. This is true even though some of the MEMS microphones are top port microphones and others are bottom port microphones.

Conversely, microphones that are only top port microphones can have different acoustic or electrical characteristics compared to microphones that are only bottom port microphones. When these top port and bottom port microphones are used within a device, their different characteristics may have to be taken into account. For example, a processor of the smartphone may have to compensate for the differences in the characteristics of the top port microphones and the bottom port microphones. However, using the same style of microphone for the top and bottom port microphones (e.g., the MEMS microphone 100) can assure that all of the microphones in a device perform similarly and have the same or similar acoustic and/or electrical properties. Using multiple MEMS microphones 100 eliminates the need for some portion of the device to compensate for different characteristics of microphones with different characteristics.

Figure 2A:
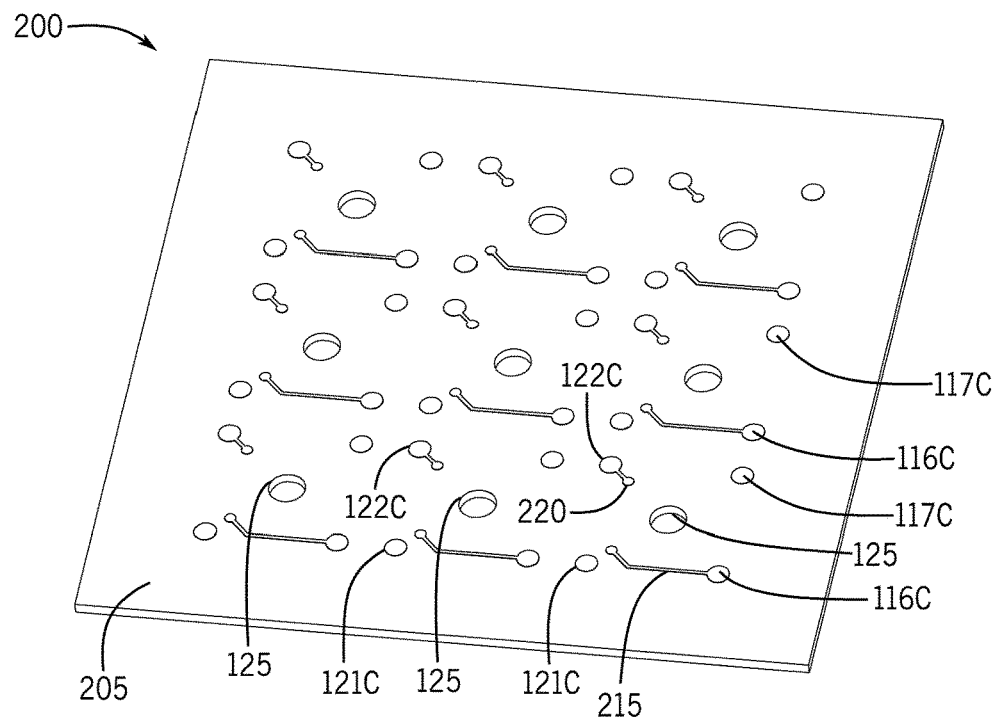
FIGS. 2A and 2B are illustrations of a base panel in accordance with an illustrative embodiment.
Figure 2B:
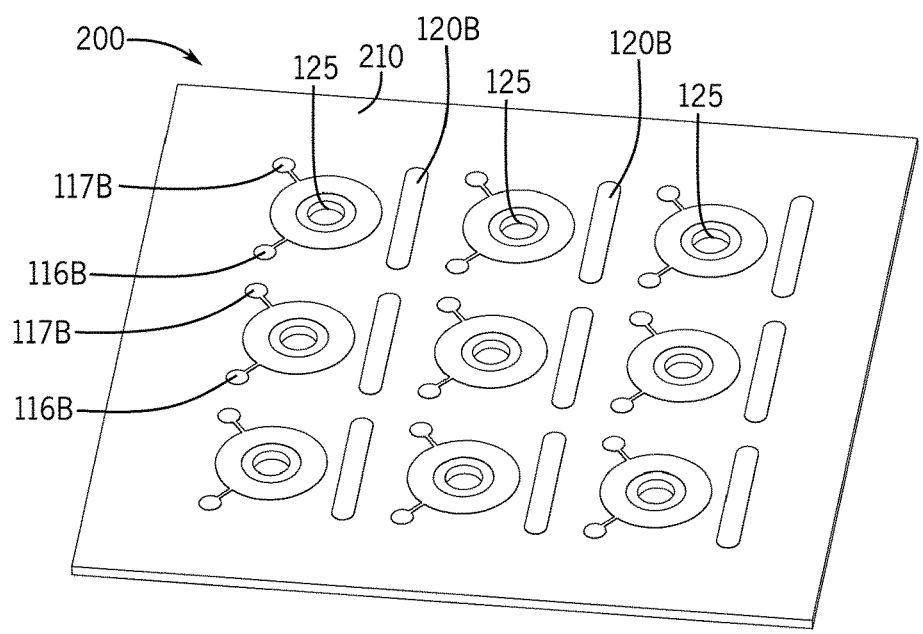

The MEMS microphone 100 includes a package (e.g., a base and a lid). Multiple packages can be formed by creating a panel of packages. FIGS. 2A and 2B are illustrations of a base panel in accordance with an illustrative embodiment. The base panel 200 can be used to create the base 135 of multiple packages. FIG. 2A shows the top surface 205 of the base panel 200, and FIG. 2B shows the bottom surface 210 of the base panel 200. The bottom surface 210 of the base panel 200 becomes the bottom surface 110 of a MEMS microphone 100.

The base panel 200 can be used to create nine packages (e.g., MEMS microphones 100). The embodiment shown in FIGS. 2A and 2B is meant to be illustrative only. In alternative embodiments, the base panel 200 can be used to create hundreds or thousands of packages. In such embodiments the base panel 200 can be about four square inches. In yet other embodiments, any suitable size of the base panel 200 may be used to create any suitable number of packages.

The bottom surface 210 of the base panel 200 has the first electrical pads 116B and 117B; the top surface 205 of the base panel 200 has first electrical pads 116C and 117C. The first electrical pads 116C of the top surface 205 are electrically connected through the base panel 200 (e.g., through respective vias) to the first electrical pads 116B of the bottom surface 210. The first electrical pads 117C of the top surface 205 are electrically connected through the base panel 200 (e.g., through respective vias) to the first electrical pads 117B of the bottom surface 210. Similarly, the top surface 205 includes second electrical pads 121C and 122C that are electrically connected (e.g., through respective vias) to the electrical pad 120B of the bottom surface 210.

The top surface 205 includes traces 215 and 220 that can be used to electrically connect the MEMS die 130 to the first electrical pads 116C/117C and the second electrical pads 120A/121C/122C, respectively. For example, the trace 215 can be electrically connected to the negative terminal of the amplifier contained on the MEMS die 130, and the trace 220 can be connected to the positive terminal of the amplifier contained on the MEMS die 130. In an illustrative embodiment, the amplifier amplifies a signal from the MEMS die 130. In another example, the trace 215 can be electrically connected to a backplate of the MEMS die 130, and the trace 220 can be connected to the diaphragm of the MEMS die 130.

Figure 3A:
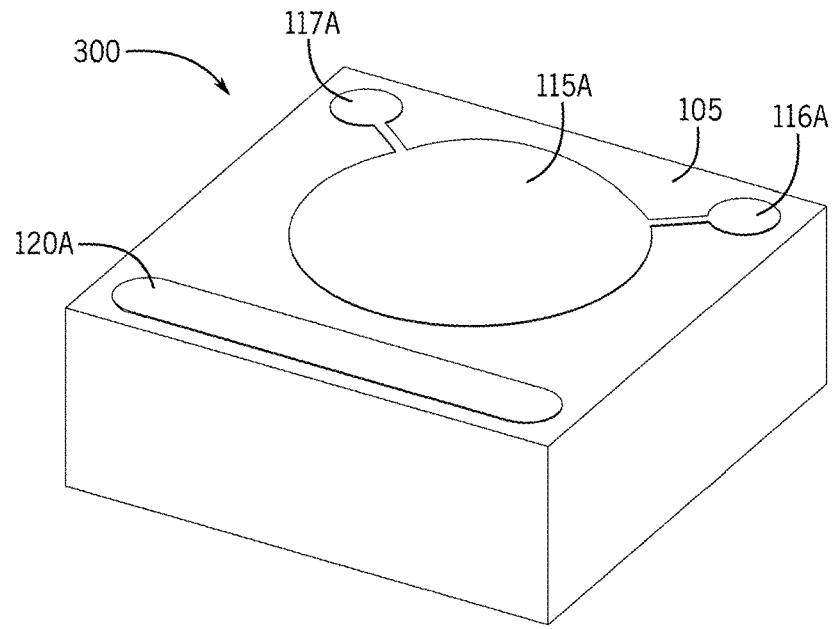
FIGS. 3A and 3B are illustrations of a lid in accordance with an illustrative embodiment.
Figure 3B:
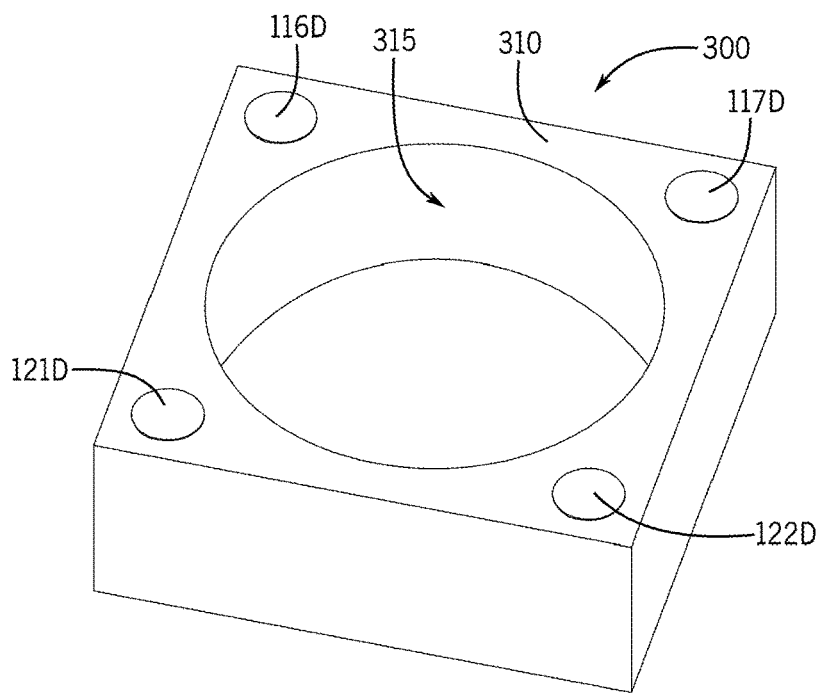

FIGS. 3A and 3B are illustrations of a lid in accordance with an illustrative embodiment. FIG. 3A shows the top surface 105 of the lid 300, and FIG. 3B shows the bottom surface 310 of the lid 300. The top surface 105 of the lid 300 is the top surface 105 of the MEMS microphone 100 and includes the first electrical pads 115A, 116A, and 117A and the second electrical pad 120A. The bottom surface 310 of the lid 300 includes first electrical pads 116D and 117D that are electrically connected through the lid 300 to the electrical pads 116A and 117A of the top surface 105, respectively. The second electrical pads 121D and 122D of the bottom surface 410 are electrically connected through the lid 300 to the electrical pad 120A of the top surface 105.

In an illustrative embodiment, the body of the lid 300 is made of two printed circuit boards that are attached with epoxy, glue, or any other suitable bonding agent. In an alternative embodiment, the body of the lid 300 is made of one printed circuit board or more than two printed circuit boards. The lid 300 includes a cavity 315 that is formed in the lid 300. The cavity 315 can be made, for example, by drilling the body of the lid 300. For example, one of the two printed circuit boards that are attached to one another is drilled through, and the cavity 315 is formed when the circuit boards are attached to one another. In an alternative embodiment, the cavity 315 can be formed into a single printed circuit board with a drill. For example, a center cutting end mill can be used to drill the cavity 315 with a flat circular surface. Using a drill is a relatively cheap method of forming the cavity 315. For example, in alternative embodiments, the cavity 315 can be formed by routing the cavity 315. In such embodiments, the cavity 315 can be any suitable shape, such as square or rectangular.

In the embodiment shown in FIG. 3B, the cavity 315 has a circular shape (e.g., a cylindrical volume). In such an embodiment, the cavity 315 can be formed with a drill bit. Forming the circular cavity 315 with a drill bit is easier, less expensive, and less time consuming than forming the cavity 315 with a router.

Traditional MEMS microphones maximize the size of the cavity within the lid (e.g., the cavity within the MEMS microphone 100) to enhance the acoustic qualities of the microphone. Thus, traditional MEMS microphones have the inside of the lid routed such that the walls of the lid are as thin as possible (e.g., while still maintaining structural integrity). Similarly, traditional MEMS microphones have the inside of the lid routed to match the shape of the lid (e.g., square or rectangular).

However, in an illustrative embodiment, the cavity 315 is drilled using a circular bit. Forming a circular cavity 315 within a square or rectangular lid 300 provides relatively thick corners of the lid 300. The relatively thick corners can have vias formed through the thickness of the lid 300. In an illustrative embodiment, the vias are hollow portions formed in the corners of the lid 300. For example, the vias can be formed using conventional drilling or laser drilling. The vias can be coated or filled with a conductive material such as copper or solder. Thus, electrical signals can be passed through the lid 300 by way of the vias. Accordingly, the first electrical pads 116A and 117A of the top surface 105 and the first electrical pads 116D and 117D, respectively, of the bottom surface 310 can be electrically connected by way of the vias, and the second electrical pad 120A can be electrically connected to the second electrical pads 121D and 122D by way of the vias.

Figure 4:
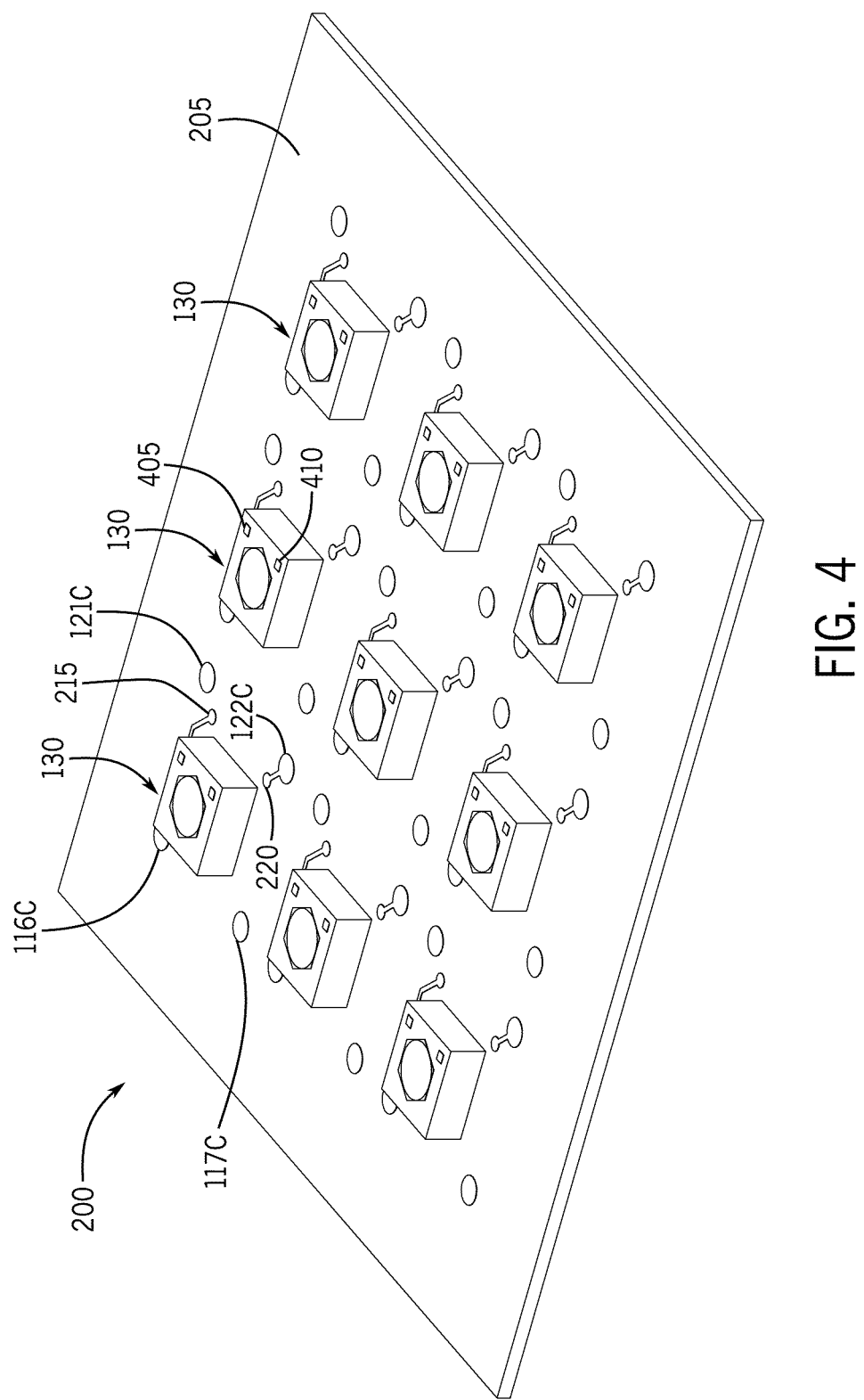
FIG. 4 is an illustration of a base with attached MEMS dies in accordance with an illustrative embodiment.

FIG. 4 is an illustration of a base with attached MEMS dies in accordance with an illustrative embodiment. In the embodiment shown in FIG. 4, MEMS dies 130 are attached to the top surface 205 of the base panel 200. The MEMS dies 130 are attached over the ports 125 (e.g., as shown in FIG. 1C). The MEMS dies 130 can be attached to the base panel 200 via any suitable method, such as with an epoxy or glue. The MEMS dies 130 include electrical pads 405 and 410 that can be attached to the traces 215 and 220 by way of, for example, wire bonds (not shown in the figures). In an illustrative embodiment, the MEMS die 130 can be electrically attached to the traces 215 and 220 with solder. For example, flip chip technology can be used to mechanically and electrically attach the MEMS die 130 to the base 135. In such an example, an underfill substance can be used to acoustically seal the MEMS die 130 with the base 135. Any suitable method can be used to electrically attach the electrical pads 405 and 410 to the traces 215 and 220. In an illustrative embodiment, the electrical pad 405 is connected to the trace 215, and the electrical pad 410 is connected to the trace 220. Accordingly, the electrical pad 405 is electrically connected to the first electrical pads 115A-C, 116A-C, and 117A-C, and the electrical pad 410 is electrically connected to the second electrical pads 120A/120B, 121C/D, and 122C/D.

In an illustrative embodiment, the electrical pad 405 is electrically connected to the backplate of the MEMS die 130, and the electrical pad 410 is electrically connected to the diaphragm of the MEMS die 130. In an alternative embodiment, the electrical pad 405 is electrically connected to the diaphragm of the MEMS die 130, and the electrical pad 410 is electrically connected to the backplate of the MEMS die 130.

In an illustrative embodiment, the MEMS die 130 includes a circuit such as an application specific integrated circuit (ASIC) or a complementary metal-oxide semiconductor (CMOS). For example, the MEMS die 130 can be a high impedance node. In such embodiments, the electrical pads 405 and 410 can make electrical connections to the circuit. In alternative embodiments, the MEMS die 130 may not include the circuitry. For example, the MEMS microphone 100 can include the circuitry located within the cavity 315. In such an example, the circuitry may be mounted to the base 135. In some embodiments, the MEMS microphone 100 may not include the ASIC or CMOS circuitry.

In some embodiments, the MEMS die 130 can include more than two electrical pads. In such embodiments, the MEMS microphone 100 can include any suitable number of electrical pads and any suitable number or arrangement of vias. In embodiments in which more than four vias are used through the lid 300, the lid 300 can be rectangular in shape. The cavity 315 can be round and offset to one side of the lid 300. In such an embodiment, multiple vias can be located on the opposite side of the lid 300 than the cavity 315.

Figure 5:
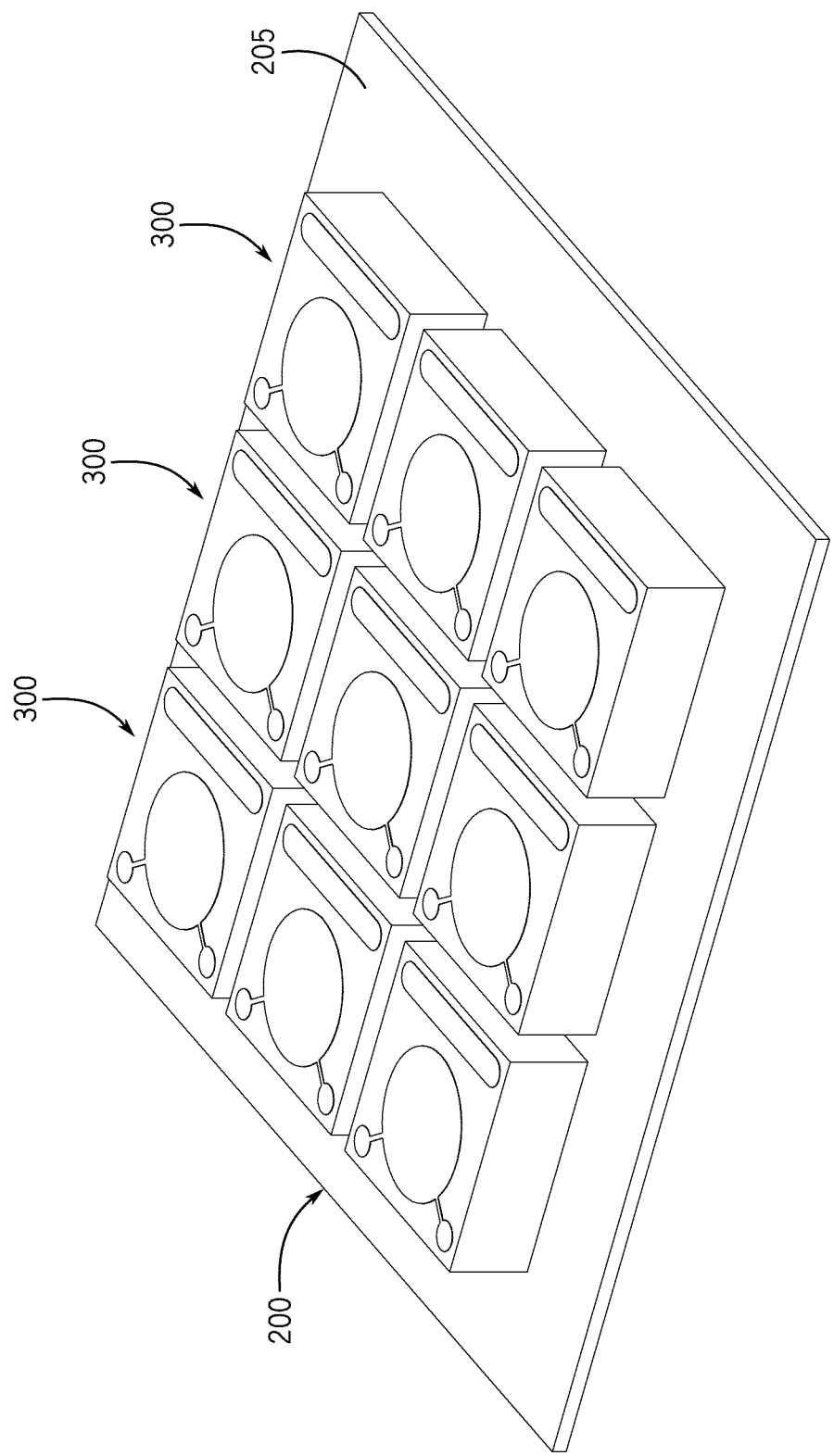
FIG. 5 is an illustration of a base with attached lids in accordance with an illustrative embodiment.

FIG. 5 is an illustration of a base with attached lids in accordance with an illustrative embodiment. In an illustrative embodiment, multiple lids 300 shown in FIGS. 3A and 3B are attached to the base panel 200 around the MEMS dies 130 of FIG. 4. In an illustrative embodiment, solder bumps are attached to the first electrical pads 116D and 117D and the second electrical pads 121D and 121D of the lid 300 of FIG. 3B. In an alternative embodiment, solder bumps are attached to the first electrical pads 116C and 117C and the second electrical pads 121C and 122C of the base panel 200.

In either embodiment, the first electrical pads 116D and 117D and the second electrical pads 121D and 122D of the lid 300 are aligned with the first electrical pads 116C and 117C and the second electrical pads 121C and 122C of the base panel 200. The solder bumps can be reflowed to attach the respective electrical pads. The surface tension of the molten solder maintains the alignment of the conductive surfaces of the electrical pads. When the solder cools and solidifies, the lids 300 are attached to the base panel 200, and the electrical pads are conductively connected via the solder. In alternative embodiments, any suitable method of connecting the lids 300 to the base panel 200 can be used.

Figure 6:
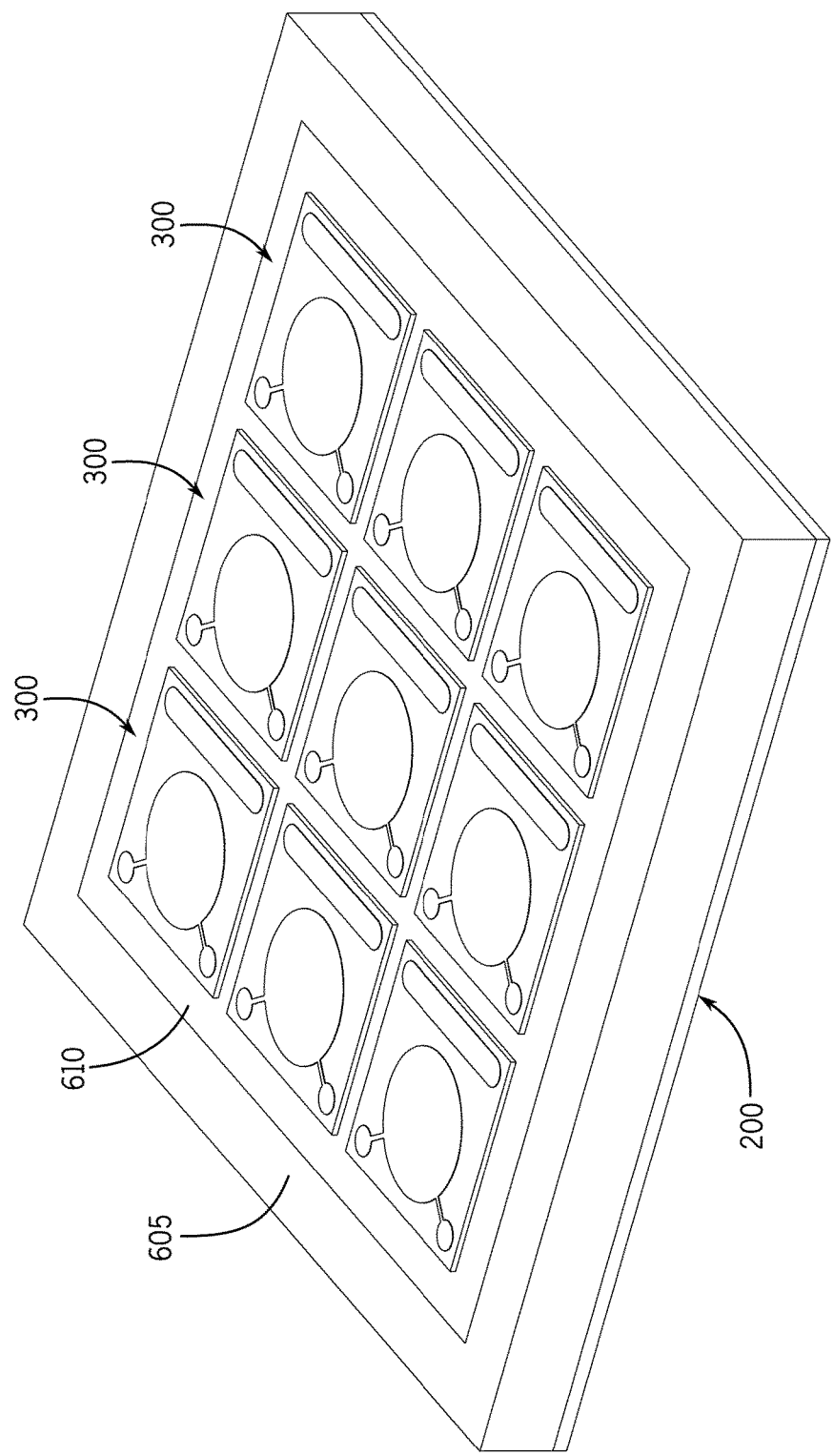
FIG. 6 is an illustration of a panel of MEMS microphone packages in accordance with an illustrative embodiment.

FIG. 6 is an illustration of a panel of MEMS microphone packages in accordance with an illustrative embodiment. In the embodiment shown in FIG. 6, a frame 605 that surrounds the lids 300 is placed on the base panel 200. An epoxy 610 is flowed within the volume between the lids 300 and the frame 605. As mentioned above, solder can be used to attach the lids 300 to the base panel 200. In such an embodiment, the solder can be located between the lids 300 and the base panel 200 such that the lids 300 do not sit flush against the base panel 200.

In an illustrative embodiment, for optimal acoustic performance, the inside volume of the MEMS microphone 100 is sealed such that air pressure equalizes between the outside environment (e.g., the atmosphere) and the inside volume of the MEMS microphone 100 through the MEMS die 130. In such an embodiment, the space between the lids 300 and the base panel 200 can be filled with the epoxy 610. The epoxy 610 can be viscous enough that the epoxy 610 does not flow into the inside volume of the MEMS microphone 100, but does flow between the lids 300 and the base panel 200. In an alternative embodiment, the epoxy 610 does not flow into the space between the lids 300 and the base panel 200, but creates a seal between the outside wall of the lids 300 and the base panel 200.

In embodiments in which the epoxy 610 is used to seal the lids 300 and the base panel 200, the epoxy 610 may not be filled to the top of the frame 605. In such embodiments, enough epoxy 610 may be used to seal the lids 300 and the base panel 200, but not so much epoxy 610 is used to cause the epoxy 610 to flow onto or overtop the lids 300. If the epoxy 610 flowed overtop the lids, the first electrical pads 115A, 116A, and 117A and the second electrical pad 120A of the top surface 105 could be partially or entirely blocked. The epoxy 610 can be filled such that the epoxy 610 does not extend above the top surface 105 of the lids 300, thereby preventing the top surface 105 from sitting flush against another surface (e.g., another printed circuit board to which the MEMS microphone 100 is mounted). For example, the epoxy 610 can fill between 25%-75% of the volume between the frame 605 and the lids 300. In alternative embodiments, the epoxy 610 can fill less than 25% or greater than 75% of the volume between the frame 605 and the lids 300.

In the embodiment of the MEMS microphone 100 shown in FIGS. 1A-1C, the inside surface of the lid 300 is not coated with a conductive material. In some MEMS microphones, the inside surface of the lid is coated with a conductive material such as copper to protect the internal components of the MEMS microphones from electromagnetic interference. In some embodiments, the MEMS microphone 100 can be small enough that the first electrical pads 115A, 115B, 116A, 116B, 117A, and 117B and the second electrical pads 120A and 120B provide sufficient protection from electromagnetic interference and the inside surface of the lid 300 is not coated with a conductive material. In some embodiments, techniques described in U.S. patent application Ser. No. 14/632,428 with respect to forming and dicing packages can be used, which is incorporated herein by reference in its entirety.

In some embodiments electromagnetic interference protection can be provided by the epoxy 610. For example, the epoxy 610 can be a conductive epoxy. The conductive epoxy can include suspended particles of conductive materials such as silver, gold, etc. In such an embodiment, the epoxy 610 can mostly or completely fill the volume between the frame 605 and the lids 300. For example, the epoxy 610 can fill 90% of the volume between the frame 605 and the lids 300. In such an embodiment, the conductive epoxy 610 is filled such that the first electrical pads 115A, 116A, 117A and the second electrical pad 120A do not contact the epoxy 610.

The panel of packages 600 of FIG. 6 can be diced between the lids 300 to form individual MEMS microphones 100. In embodiments in which the epoxy 610 does not flow between the lids 300 and the base panel 200, the epoxy 610 can remain along the outside wall of the lids 300, such as the embodiment shown in FIGS. 1A-1C. In embodiments in which the epoxy 610 seals the lids 300 to the base panel 200 (e.g., the base 135) between the lids 300 and the base panel 200, the MEMS microphones 100 can be diced such that there is no epoxy 610 along the outside wall of the lids 300. In some such embodiments, the vias through the lid 300 can be partially exposed to create castellated vias. The castellated vias can be used to create an electrical connection with an external circuit (e.g., as opposed or in addition to using the first electrical pads 115A, 115B, 116A, 116C, 117A, and 117B and the second electrical pads 120A and 120B). In such embodiments, the epoxy 610 can be non-conductive.

Figure 7:
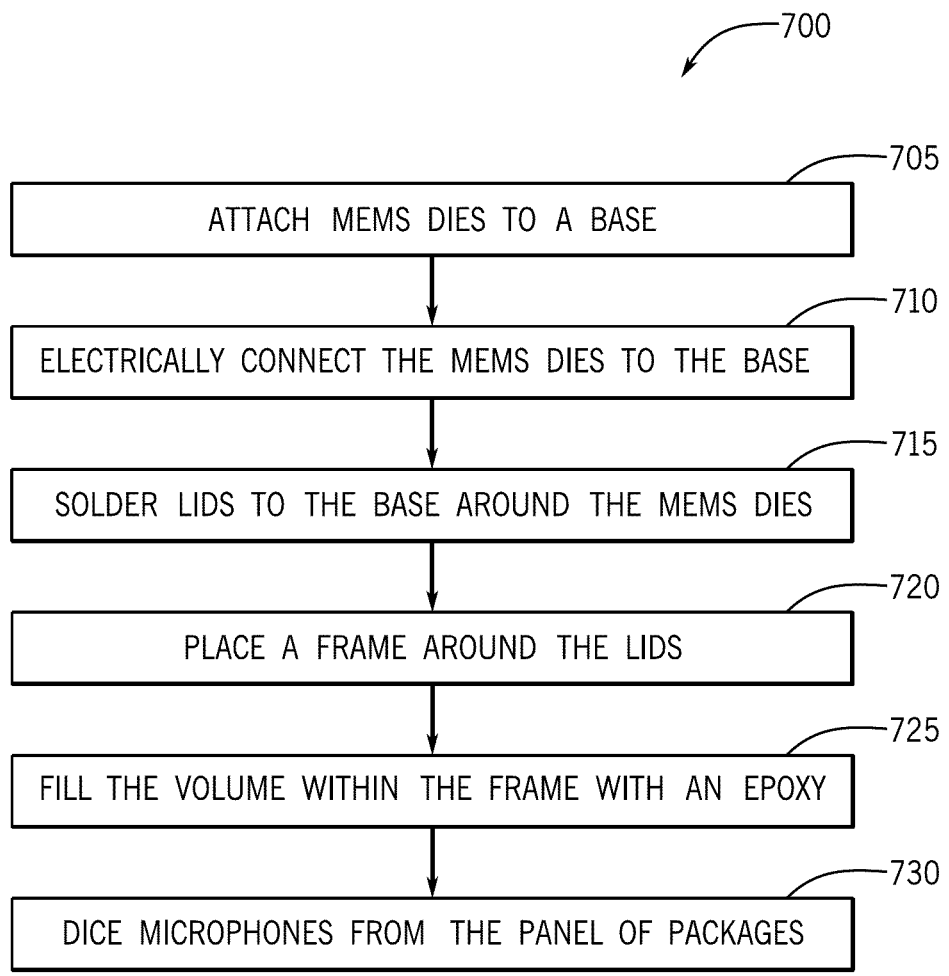
FIG. 7 is a flow chart of a method of assembling MEMS microphones in accordance with an illustrative embodiment.

FIG. 7 is a flow chart of a method of assembling MEMS microphones in accordance with an illustrative embodiment. In alternative embodiments, additional, fewer, and/or different operations may be performed. Also the use of a flow chart and arrows is not meant to be limiting with respect to the order or flow of operations. For example, in an alternative embodiment, two or more operations may be performed simultaneously.

In an operation 705, MEMS dies are attached to a base. For example, the MEMS dies 130 can be attached to the base panel 200 as in FIG. 4. In an illustrative embodiment, epoxy is used to attach the MEMS dies to the base. The MEMS dies can each be placed around a port in the base. Any suitable MEMS dies can be used. For example, each MEMS die can be configured to convert an acoustic signal into an electrical signal. In an illustrative embodiment, the MEMS dies each include an integrated circuit.

In an operation 710, the MEMS dies are electrically connected to the base. For example, the pads 405 and 410 of the MEMS dies 130 can be connected to the traces 215 and 220. In an illustrative embodiment, wire bonds are used to electrically connect the MEMS dies to the base.

In an operation 715, lids are soldered to the base and the lids surround the MEMS dies. For example, the lids 300 can be placed over the MEMS dies 130, as shown in FIG. 5. The vias that pass through the lids can be soldered to vias in the base.

In an operation 720, a frame is placed around the lids. For example, the frame 605 is placed on top of the base and around the lids to form a volume between the lids, the base, and the frame. In an operation 725, the volume is filled with an epoxy. In an illustrative embodiment, the volume is partially filled. In some embodiments, the operation 725 includes flowing the epoxy between the lids and the base, but not into the cavity of the lid to seal the lid and the base. In some embodiments, the operation 725 includes sealing the lid and the base around the outside wall of the lid and the top surface of the base (e.g., as shown in FIGS. 1A-1C).

In an operation 730, microphone packages are diced from the panel of packages. In an illustrative embodiment, dicing the packages includes cutting between the lids such that each microphone package includes one lid with one MEMS die within the package, as in FIGS. 1A-1C. In an illustrative embodiment, the operation 730 includes leaving some epoxy around the side walls of the lids (e.g., as shown in FIGS. 1A-1C). In an alternative embodiment, the epoxy around the side walls of the lids is removed. In some embodiments, the side walls of the lids are themselves cut. For example, the side walls of the lids can be cut to expose vias that pass through the lid to form castellated vias. In such embodiments, epoxy can remain between the lids and the base such that there is a seal between the lid and the base around the perimeter of the base and lid.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microphone comprising:
a microelectromechanical system (MEMS) die configured to sense an acoustic signal,
a base with a top surface and a bottom surface, wherein the bottom surface comprises a first electrical pad and a second electrical pad, wherein the first electrical pad and the second electrical pad are configured to transmit an electrical signal indicative of the acoustic signal; and
a lid with a top surface and a bottom surface, wherein the lid comprises a cavity that surrounds the MEMS die, and wherein the top surface of the lid comprises a third electrical pad and a fourth electrical pad, wherein the first electrical pad and the third electrical pad are electrically connected by way of a first via through the lid, and wherein the second electrical pad and the fourth electrical pad are electrically connected by way of a second via through the lid.

2. The microphone of claim 1, wherein the base comprises a port that allows the acoustic signal to pass through the base.

3. The microphone of claim 1, wherein the base and the lid are acoustically sealed to one another with an epoxy.

4. The microphone of claim 3, wherein the epoxy is between the base and the lid around a continuous perimeter of the base.

5. The microphone of claim 3, wherein the epoxy forms a seal between the top surface of the base and a side surface of the lid around a perimeter of the base and the lid.

6. The microphone of claim 3, wherein the epoxy comprises a conductive material, and wherein the epoxy is configured to shield the MEMS die from electromagnetic interference.

7. The microphone of claim 1, wherein the cavity is cylindrical.

8. The microphone of claim 7, wherein a perimeter of the lid is rectangular.

9. The microphone of claim 8, wherein the lid comprises an inside wall that defines the cavity, wherein the lid comprises an outside wall along a perimeter of the lid, and wherein the first via and the second via pass through the lid between the inside wall and the outside wall.

10. The microphone of claim 1, wherein the first electrical pad and the second electrical pad are on opposite sides of the microphone from the third electrical pad and the fourth electrical pad.

11. A method comprising:
attaching a microelectromechanical system (MEMS) die to a base, wherein the MEMS die is configured to convert an acoustic signal into an electrical signal;
electrically connecting a first pad on the MEMS die to a first trace on a top surface of the base;
electrically connecting a second pad on the MEMS die to a second trace on the top surface of the base;
soldering a first via of a lid to a first via of the base, wherein the first via of the base is electrically connected to the first trace and to a first pad on a bottom surface of the base, and wherein the first via of the lid is electrically connected to a first pad on the lid;
soldering a second via of the lid to a second via of the base, wherein the second via of the base is electrically connected to the second trace and to a second pad on the bottom surface of the base, and wherein the second via of the lid is electrically connected to a second pad on the lid.

12. The method of claim 11, further comprising sealing the lid to the base using an epoxy.

13. The method of claim 12, wherein said sealing the lid to the base comprises causing epoxy to flow between the lid and the base around a perimeter of the base.

14. The method of claim 12, wherein said sealing the lid to the base comprises forming a seal between a side wall of the lid and the top surface of the base around a perimeter of the base and the lid.

15. The method of claim 11, wherein said attaching the MEMS die to the base comprises placing the MEMS die over a port in the base.

16. The method of claim 11, wherein said attaching the MEMS die to the base comprises using an epoxy to secure the MEMS die to the base.

17. The method of claim 11, wherein said soldering the first via of the lid to the first via of the base causes the first pad on the lid to be electrically connected to the first pad on the bottom surface of the base, and wherein said soldering the second via of the lid to the second via of the base causes the second pad on the lid to be electrically connected to the second pad on the bottom surface of the base.

18. The method of claim 11, further comprising placing the lid onto the base such that a cylindrical cavity of the lid surrounds the MEMS die.

19. The method of claim 11, further comprising dicing a package from a panel of packages, wherein the package comprises the base and the lid, and wherein the MEMS die is within the package.

\* \* \* \* \*